(12) United States Patent
Yao et al.

(10) Patent No.: US 6,221,558 B1
(45) Date of Patent: Apr. 24, 2001

(54) ANTI-REFLECTION OXYNITRIDE FILM FOR POLYSILICON SUBSTRATES

(75) Inventors: Liang-Gi Yao, Taipei; John Chin-Hsiang Lin, Kaohsiung; Hua-Tai Lin, Tainan; Erik S. Jeng; Hsiao-Chin Tuan, both of Hsinchu, all of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/054,350

(22) Filed: Apr. 2, 1998

(51) Int. Cl.$^7$ ........................................ G03F 7/11
(52) U.S. Cl. ............................ 430/272.1; 430/311
(58) Field of Search ............................ 430/272.1, 311

(56) References Cited

U.S. PATENT DOCUMENTS 5,472,827 * 12/1995 Ogawa et al. .................. 430/315
5,639,687   6/1997 Roman et al. .
5,674,356 * 10/1997 Nagayama .................. 156/659.11
5,677,111 * 10/1997 Ogawa et al. .................. 430/313

* cited by examiner

*Primary Examiner*—Cynthia Hamilton
(74) *Attorney, Agent, or Firm*—Christensen O'Connor Johnson Kindness PLLC

(57) ABSTRACT

The present invention provides an anti-reflection films for lithographic application on polysilicon containing substrate. A structure for improving lithography patterning in an integrated circuit comprises a polysilicon layer, a diaphanous layer located above the polysilicon layer, an anti-reflection layer located above the diaphanous layer, and then a photoresist layer located above the anti-reflection layer for patterning the integrated circuit pattern. The anti-reflection layer is preferably oxynitride.

12 Claims, 1 Drawing Sheet

ANTI-REFLECTION OXYNITRIDE FILM FOR POLYSILICON SUBSTRATES

BACKGROUND OF THE INVENTION

1. Field of the Invention

The present invention relates to anti-reflection films for lithographic application, especially for polysilicon containing substrate.

2. Description of the Prior Art

Microcircuit fabrication requires that precisely controlled quantities of impurities be introduced into tiny regions of the silicon substrate. Subsequently, these regions must be interconnected to create components and VLSI circuits. The patterns that define such regions are created by a photolithographic process. As semiconductor devices become more highly integrated, the line width of VLSI circuits typically becomes scaled down. The semiconductor industry's drive toward integrated circuits with ever decreasing geometries, coupled with its pervasive use of highly reflective materials, such as polysilicon, aluminum, and metal suicides, has led to increased photolithographic patterning problems. Unexpected reflections from these underlying materials, during the photoresist-patterning step, result in the photoresist pattern being distorted.

This problem is further compounded when the photolithographic process is in the ultraviolet (UV) or deep ultraviolet (DUV) wavelength range. The patterns formed in the photoresist are easily compromised by the effects of uncontrolled reflections from the underlying materials due to the increased optical metallic nature of the underlying reflective materials at these wavelengths. Therefore, the fabrication of advanced integrated circuits with submicron geometries is limited.

SUMMARY OF THE INVENTION

It is an object of the present invention to provide anti-reflection films for lithographic application on polysilicon containing substrate.

In one embodiment of the present invention, a structure for improving lithography patterning in an integrated circuit comprises a polysilicon layer, an optional diaphanous layer located above the polysilicon layer, an anti-reflection layer located above the diaphanous layer, and then a photoresist layer located above the diaphanous layer for patterning integrated circuit pattern. The anti-reflection layer is preferably oxynitride.

The method for forming a structure for improving lithography patterning in an integrated circuit comprises the steps of: providing a polysilicon layer, optionally forming a diaphanous layer over the polysilicon layer, forming an anti-reflection layer over the diaphanous layer, forming a photoresist layer on the anti-reflection layer, and then exposing a portion of the photoresist layer to electromagnetic radiation having a wavelength of less than 440 nanometers.

DESCRIPTION OF THE PREFERRED EMBODIMENT

The present invention will be described in detail with reference to the drawings. The purpose of the present invention is to provide an anti-reflection film for lithographic application, especially for polysilicon containing substrate. The precise optical characteristics of the anti-reflection film, preferably formed of oxynitride ($SiN_xO_y$), is dependent upon the recipe of the process for forming the oxynitride film. For example, the gas flow rate of $SiH_4$, $N_2O$, the deposition pressure, gas spacing (the distance between showerhead and susceptor), and the power of the plasma all affect the optical characteristics of the oxynitride film.

Figure 1:
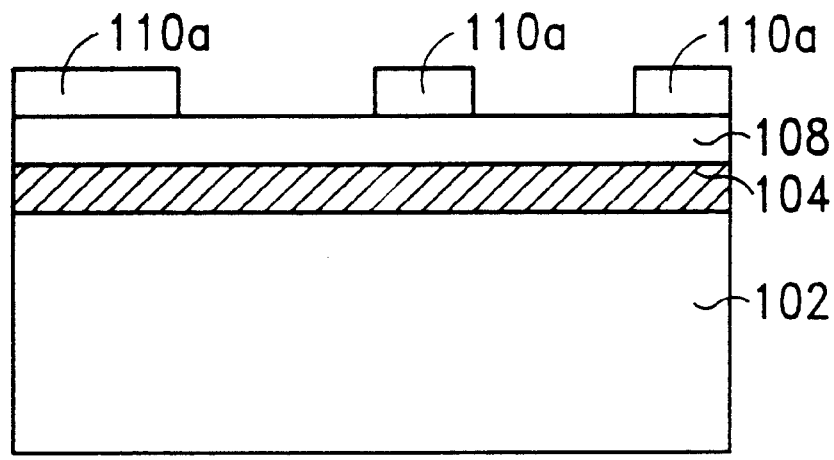
FIG. 1 is a cross section view of a first embodiment of the present invention.

FIG. 1 shows a cross section view of a first embodiment of the present invention. A polysilicon layer 104 is formed on a substrate 102. As can be appreciated by those skilled in the art, the formation of the polysilicon layer 104 atop the substrate 102 is often an intermediate step in the formation of integrated circuit. Specifically, the polysilicon layer 104 is typically used as a conductive layer.

An anti-reflection layer 108, composed of oxynitride ($SiN_xO_y$), is then formed on the polysilicon layer 104. In this preferred embodiment, the oxynitride ($SiN_xO_y$) is deposited by plasma-enhanced CVD method. Using $SiH_4$ and $N_2O$ as reactants, the flow rate of $SiH_4$ is approximately 35 to 75 sccm, the flow rate of $N_2O$ is approximately 75 to 115 sccm, the gas spacing is 375 to 490 mils, the deposition pressure is approximately 3.0 to 7.0 torr, and the power of plasma is at a range of 90 to 140 watt. Under these conditions, the resultant oxynitride ($SiN_xO_y$) film has a refractive index in a range of 1.85 to 2.35, extinction coefficient in a range of 0.35 to 0.85, and a thickness in a range of 300 to 850 angstroms. The forgoing are the preferred ranges for the oxynitride film, and are measured at wavelength of 248 nanometers. It can be appreciated by those skilled in the art that the precise recipe for forming the oxynitride film may be varied, as long as the parameters of refractive index, extinction coefficient, and thickness are within the ranges set forth above.

Next, a photoresist layer is formed on the anti-reflection layer 108. After formation, the photoresist layer is then patterned using conventional photolithographic techniques and this results in the formation of integrated circuit pattern 110a. Integrated circuit pattern 110a is preferably formed using electromagnetic radiation having an exposure wavelength of less than 440 nanometers. In this embodiment, the reflectivity of the underlying polysilicon layer 104 is in a range of 0.1 to 0.3 with the use of the oxynitride layer.

Figure 2:
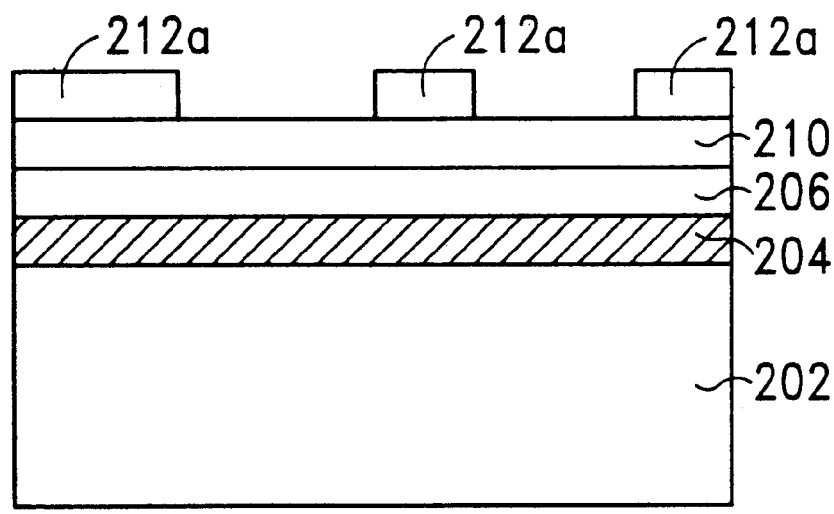
FIG. 2 is a cross section view of a second embodiment of the present invention.

FIG. 2 shows a cross section view of a second embodiment of the present invention. A polysilicon layer 204 is formed on a substrate 202. Next, a LPTEOS layer 206, or any oxide layer including PSG or BPSG, is formed on the polysilicon layer 204 with a thickness of approximately 1000 to 8000 angstroms. Further, in this embodiment, the LPTEOS layer 206 is used as a buffer layer to prevent outdiffusion of dopants. Since the polysilicon layer 204 is often used as a gate of a MOSFET, a conductor of a capacitor, or a contact materials, the outdiffusion of doping materials is minimized by the deposition of the LPTEOS layer 206. The deposition of LPTEOS also reduces the oxynitride thickness for the minimum reflectivity in the subsequent process.

An anti-reflection layer 210, composed of oxynitride ($SiN_xO_y$), is then formed on the oxide layer 206. In this preferred embodiment, the oxynitride ($SiN_xO_y$) is deposited by plasma-enhanced CVD method. Using $SiH_4$ and $N_2O$ as reactants, the flow rate of $SiH_4$ is approximately 35 to 75 sccm, the flow rate of $N_2O$ is approximately 75 to 115 sccm, the gas spacing is 375 to 490 mils, the deposition pressure is approximately 3.0 to 7.0 torr, and the power of plasma is about 90 to 140 watt. Under these conditions, the resultant oxynitride ($SiN_xO_y$) film has a refractive index in a range of 1.85 to 2.35, extinction coefficient in a range of 0.35 to 0.85, and a thickness in a range of 230 to 700 angstroms. It can be appreciated by those skilled in the art that the precise recipe for forming the oxynitride film may be varied, as long as the parameters of refractive index, extinction coefficient, and thickness are within the ranges set forth above.

A photoresist layer is then formed on the anti-reflection layer 210. After formation, the photoresist layer is then patterned using conventional photolithographic techniques and this results in the formation of integrated circuit pattern 212a. Integrated circuit pattern 212a is preferably formed using electromagnetic radiation having an exposure wavelength less than 440 nanometers. In this embodiment, the reflectivity is at a range of 0.1 to 0.3 with the use of the oxynitride layer 210.

As is understood by a person skilled in the art, the foregoing preferred embodiments of the present invention are illustrations of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A multilayer structure formed on a polysilicon layer for lithography patterning in an integrated circuit, comprising:
    a diaphanous layer formed atop said polysilicon layer;
    an anti-reflection layer formed from oxynitride ($SiN_xO_y$) directly atop said diaphanous layer; and
    a photoresist layer located above said anti-reflection layer for patterning said integrated circuit pattern.

2. The structure of claim 1, wherein said diaphanous layer is a LPTEOS layer.

3. The structure of claim 1, wherein said anti-reflection layer is oxynitride ($SiN_xO_y$) with thickness of 230 to 850 angstroms, a refraction index in a range of 1.85 to 2.35, and an extinction coefficient in a range of 0.35 to 0.85, which are measured at wavelength of 248 nanometers.

4. A method of patterning a photoresist layer in an integrated circuit, the method comprising the steps of:
    providing a polysilicon layer;
    forming a diaphanous layer atop said polysilicon layer;
    forming an anti-reflection layer of oxynitride ($SiN_xO_y$) directly atop said diaphanous layer;
    forming a photoresist layer on said anti-reflection layer; and exposing and developing a portion of said photoresist layer.

5. The method of claim 4, wherein said diaphanous layer is a LPTEOS layer.

6. The method of claim 4, wherein said anti-reflection layer is oxynitride ($SiO_xN_y$) with thickness of 230 to 850 angstroms, refraction index in a range of 1.85 to 2.35, and extinction coefficient in a range of 0.35 to 0.85, which are measured at wavelength of 248 nanometers.

7. The method of claim 6, wherein said oxynitride layer is formed by plasma-enhanced CVD method using $SiH_4$ and $N_2O$ as reactants.

8. The method of claim 7, wherein said flow rate of $SiH_4$ is in the range of 35 to 75 sccm.

9. The method of claim 7, wherein said flow rate of $N_2O$ is in the range of 75 to 115 sccm.

10. The method of claim 4, wherein said exposing of said photoresist layer is performed with electromagnetic radiation wavelength less than 440 nanometers.

11. The structure of claim 10, wherein said anti-reflection layer is oxynitride ($SiN_xO_y$) with thickness of 230 to 850 angstroms, a refraction index in a range of 1.85 to 2.35, and an extinction coefficient in a range of 0.35 to 0.85, which are measured at wavelength of 248 nanometers.

12. A multilayer structure for lithography patterning in an integrated circuit, comprising:
    a polysilicon layer;
    a diaphanous layer formed of LPTEOS atop said polysilicon layer;
    an anti-reflection layer formed from oxynitride ($SiN_xO_y$) atop said diaphanous layer; and
    a photoresist layer located above said anti-reflection layer for patterning said integrated circuit pattern.

* * * * *